United States Patent [19]

Poteet et al.

[11] Patent Number: 5,075,572

[45] Date of Patent: Dec. 24, 1991

[54] DETECTOR AND INTEGRATED CIRCUIT DEVICE INCLUDING CHARGE PUMP CIRCUITS FOR HIGH LOAD CONDITIONS

[75] Inventors: Kenneth A. Poteet, Houston; Duy Loan T. Le, Sugarland, both of Tex.

[73] Assignee: Texas Instruments Incorporated, Dallas, Tex.

[21] Appl. No.: 696,982

[22] Filed: May 2, 1991

Related U.S. Application Data

[63] Continuation of Ser. No. 525,799, May 18, 1990, abandoned, which is a continuation of Ser. No. 255,224, Oct. 11, 1988, abandoned.

[51] Int. Cl.⁵ .................. H03K 5/153; H03K 5/24
[52] U.S. Cl. .................... 307/350; 307/354; 307/296.8; 307/304
[58] Field of Search .......... 307/350, 360, 362, 475, 307/296.2, 296.4, 296.5, 296.8, 354, 304; 323/311-314

[56] References Cited

U.S. PATENT DOCUMENTS

| | | | |
|---|---|---|---|
| 3,806,741 | 4/1974 | Smith | 307/350 |
| 4,301,380 | 11/1981 | Thomas | 307/358 |
| 4,321,489 | 3/1982 | Higuchi et al. | 307/362 |
| 4,322,639 | 3/1982 | Yamashiro | 307/296.5 |
| 4,717,840 | 1/1988 | Ouyang et al. | 307/362 |
| 4,813,680 | 3/1989 | Kawashima et al. | 307/350 |
| 4,873,458 | 10/1989 | Yoshida | 307/362 |

OTHER PUBLICATIONS

Yen, "Simple Volt.-Level Detectors with CMOS Inverters", Elect. Design 13, Jun. 21, 1975, p. 102.

Primary Examiner—Timothy P. Callahan
Attorney, Agent, or Firm—Ronald O. Neerings; Lawrence J. Bassuk; Richard L. Donaldson

[57] ABSTRACT

The described embodiments of the present invention provide a voltage generation circuit for biasing a particular node to a selected voltage level. A circuit is included for monitoring when the voltage supply to the integrated circuit is well above optimal specifications. When this circuit detects an over-voltage condition, a signal is provided to multiplexing circuitry which causes a higher frequency input signal to be provided to a voltage generating charge pump. Thus, the charge pump capacity is increased. In other embodiments of the present invention other factors may be sensed and the appropriate signal supplied to the charge pump driving circuitry to provide higher biasing levels. For example, current may be sensed at the voltage supply inputs to determine when the circuit is drawing a high level of current.

6 Claims, 4 Drawing Sheets

DETECTOR AND INTEGRATED CIRCUIT DEVICE INCLUDING CHARGE PUMP CIRCUITS FOR HIGH LOAD CONDITIONS

This application is a continuation of application Ser. No. 07/525,799, filed May 18, 1990, now abandoned, which is a continuation of application Ser. No. 07/255,224, filed Oct. 11, 1988, now abandoned.

FIELD OF THE INVENTION

The present invention is related to the field of controlled voltage generation. More specifically, the present invention relates to the field of voltage generation using charge control techniques.

BACKGROUND OF THE INVENTION

In many integrated circuit designs, it is important to control the voltage level of the substrate relative to the operating devices within the integrated circuit. It is common to provide a substrate bias of one to two volts below the lowest voltage level provided by the voltage supply. Often this is done by a technique called charge pumping.

A charge pump is a circuit designed to pull charge on or off of a particular biased node by providing an oscillating signal to the input terminal of the charge pump. The oscillating signal causes a capacitor to be charged on one-half cycle of the signal and the charge to be forced on to the biased node during the other half cycle of the signal. This technique is very useful in complimentary metal oxide semiconductor circuits where latchup is a concern and in dynamic random access memories where precise control of the capacitance of a capacitor in the memory is necessary.

Integrated circuits are required to operate over a wide range of supply voltages and temperature conditions. Thus, the charge pumping circuitry must be robust enough to provide the required voltage level under a wide range of operating conditions. However, a conventional charge pump designed to be robust enough to deal with high-load operating conditions tends to draw a great deal more power than necessary when the circuit is operating at near optimal conditions.

SUMMARY OF THE INVENTION

The described embodiments of the present invention provide a voltage generation circuit for biasing a particular node, such as the substrate of an integrated circuit, to a selected voltage level. A monitoring circuit is included for monitoring when the voltage supply to the integrated circuit is well above optimal specifications. When this circuit detects an over-voltage condition, a signal is provided to multiplexing circuitry which causes a higher frequency input signal to be provided to the charge pump. Thus, the charge pump capacity is increased. In other embodiments of the present invention, other factors may be sensed and the appropriate signal supplied to the charge pump driving circuitry to provide higher substrate biasing levels. For example, current may be sensed at the voltage supply inputs to determine when the circuit is drawing a high level of current.

BRIEF DESCRIPTION OF THE DRAWINGS

The present invention may be better understood upon a reading of the following detailed description in conjunction with the drawings, wherein.

DETAILED DESCRIPTION

Figure 1:
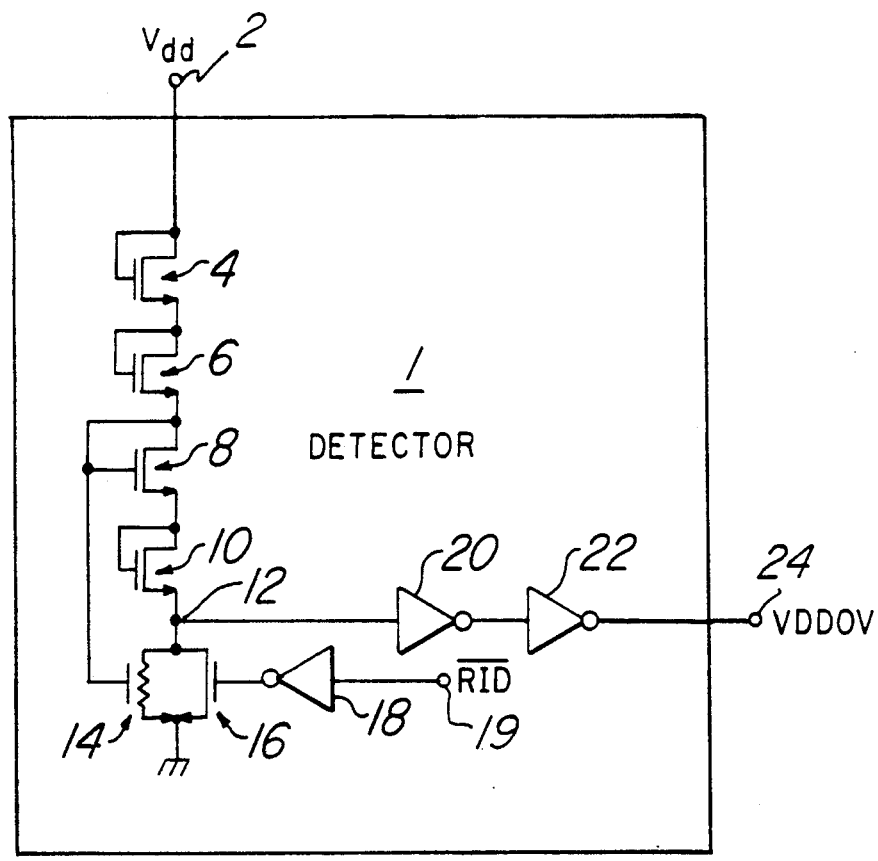
FIG. 1 is a schematic diagram of the over-voltage detection circuitry which is part of a described embodiment of the present invention.
Figure 2:
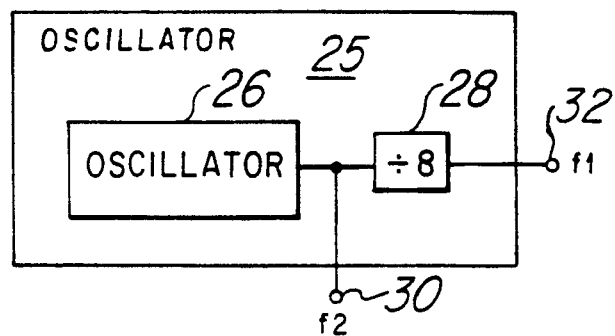
FIG. 2 is a block diagram of the oscillator and frequency divider for the a described embodiment of the present invention.
Figure 3:
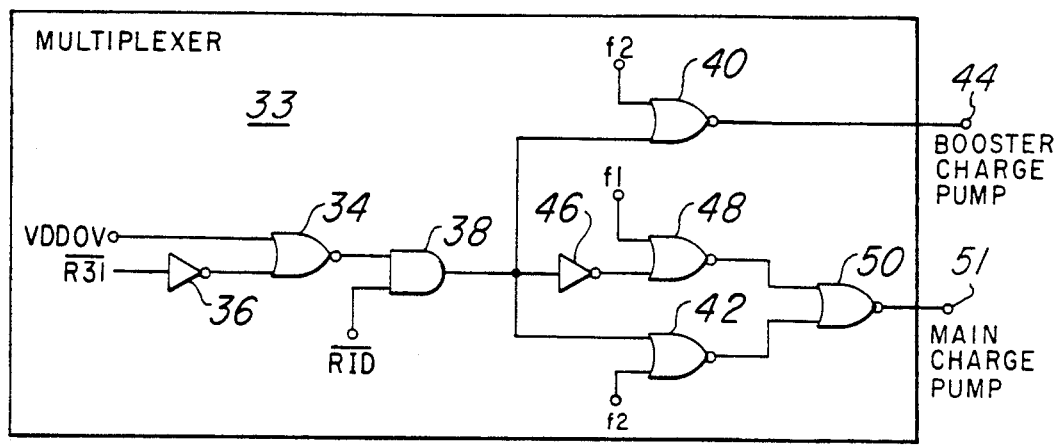
FIG. 3 is a logic diagram of the multiplexing circuitry of a described embodiment of the present invention.
Figure 4:
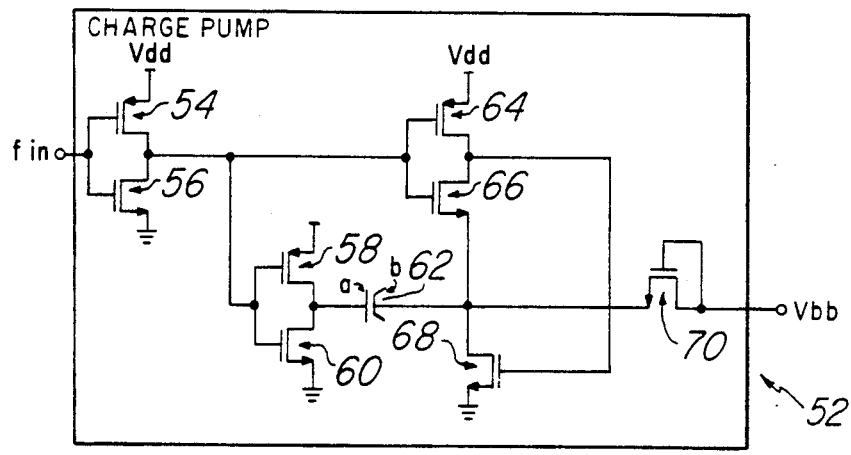
FIG. 4 is a schematic diagram of one of the charge pumps used in a described embodiment of the present invention.
Figure 5A:
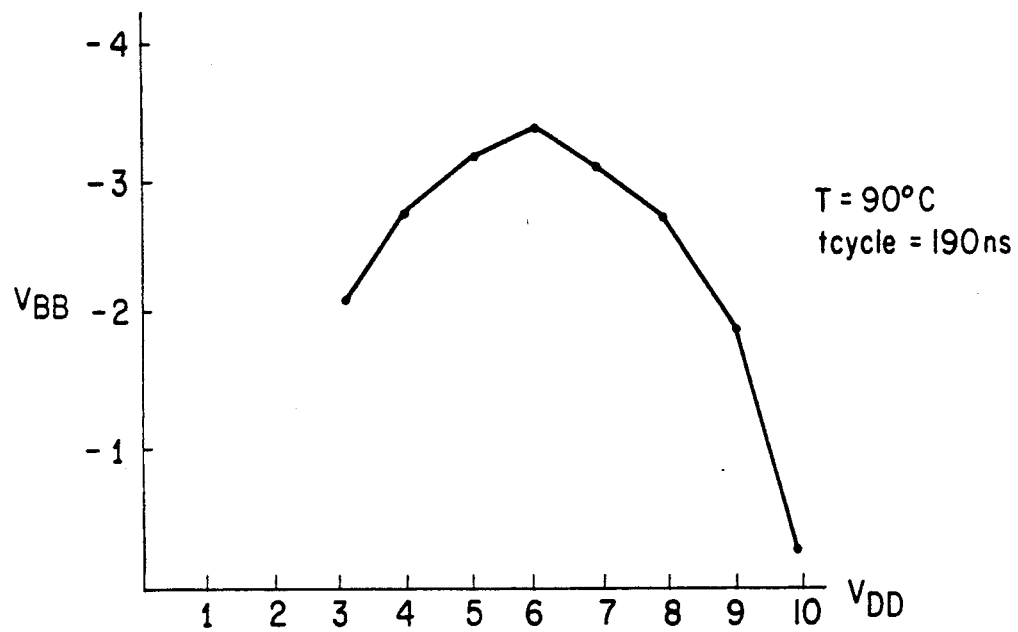
FIGS. 5a and 5b are graphs depicting the biased substrate voltage level versus the supply voltage level both without and with, respectively, a described embodiment of the present invention.
Figure 5B:
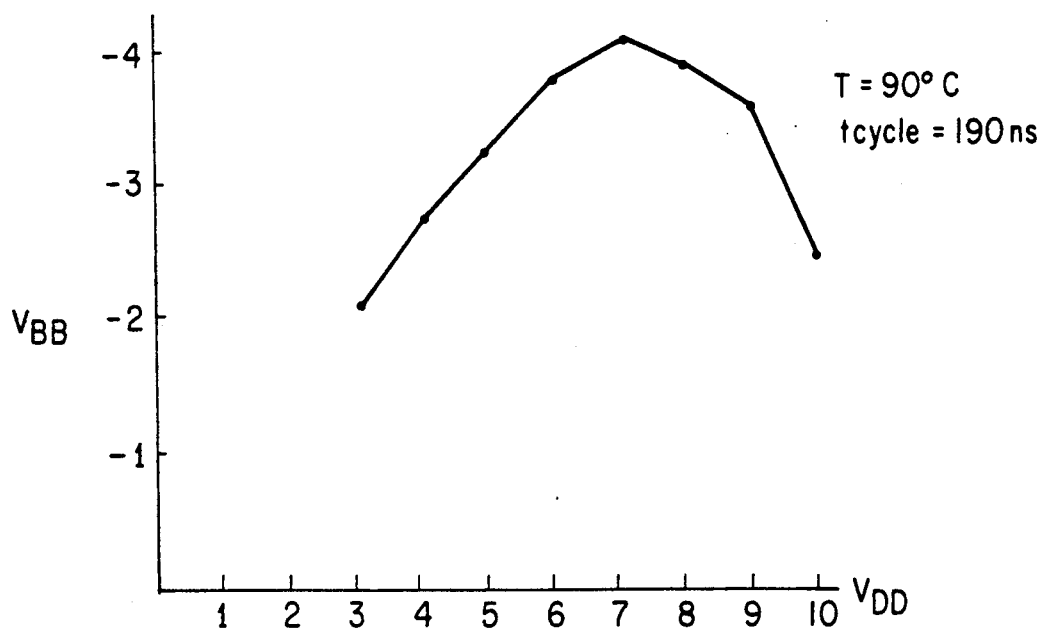
Figure 6:
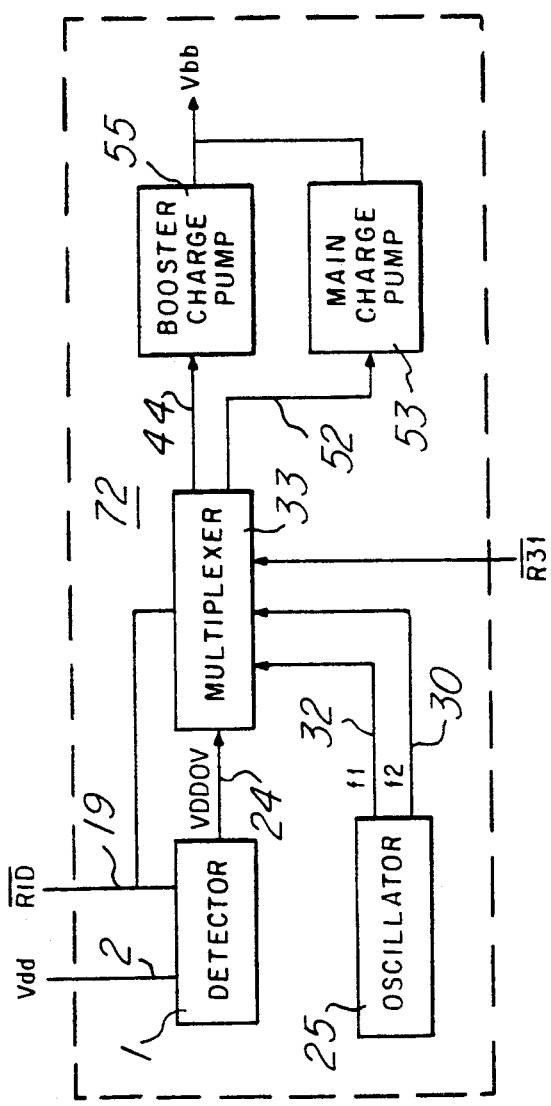
FIG. 6 is a block diagram of the voltage generation circuit of the invention.

The present invention will be described with regard to the embodiment shown in FIGS. 1 through 6. In those figures, FIG. 1 shows a voltage detector for determining when the voltage supplied to an integrated circuit containing the invention is greater than the selected value. FIG. 2 shows an oscillator and frequency divider for providing two separate frequencies to the charge pump. FIG. 3 shows a multiplexing network for determining which of the two frequencies provided by the oscillator and frequency divider of FIG. 2 are provided to a main charge pump and a booster charge pump. FIG. 4 is a schematic diagram of a charge pump, two of which are provided in the present embodiment. FIGS. 5a and 5b are graphs comparing the performance of a conventional biasing system and the performance of a biasing system including the present invention. FIG. 6 is a block diagram of the voltage generation circuit also depicted in FIGS. 1 through 4, and FIG. 7 is a table listing logic states at several locations in the block diagram of FIG. 6.

FIG. 1 is a schematic diagram showing a detector 1 for determining when an excessive voltage is supplied to the voltage supply, $V_{dd}$, to an integrated circuit. The present invention is described with regard to integrated circuitry. However, the invention is fully applicable to nonintegrated circuitry. $V_{dd}$ is applied to terminal 2. Transistors 4, 6 and 8 are gate strapped to the $V_{dd}$ side of the transistor. Thus, transistors 4, 6 and 8 will be conductive when a voltage drop of greater than 3 times $V_{th}$ is applied across the three transistors, where $V_{th}$ is the threshold voltage of the three transistors. Transistor 10 is also gate strapped and causes an additional $V_{th}$ to be dropped between the source of transistor 8 and node 12. Resistive transistor 14 has a gate tied to the gate of transistor 8. Transistor 14 is designed to have a high resistivity even when the transistor is turned on by voltage applied to the gate of transistor 14.

Transistor 16 accepts an inverted RID$_{13}$ signal, which is inverted by inverter 18. $\overline{RID}$ on terminal 19 is a signal triggered by the application of voltage to the integrated circuit. It delays the operation of circuitry on the integrated circuit until the voltages on the integrated circuit are stabilized. Because $\overline{RID}$ is inverted, until stabilization occurs, transistor 16 is on and node 12 is strapped to a reference or ground. Thus the signal provided through inverters 20 and 22 to terminal 24 is a logical zero. This signal is labeled VD-DOV and a VDDOV of logical one indicates that an over-voltage condition exists.

After the voltages on the integrated circuit are stabilized and $\overline{RID}$ is a logical 1, transistor 16 turns off and node 12 is at a point indicated by the current flowing through the chain of transistors 4, 6, 8, 10 and 14. When $V_{dd}$ is within the specifications, e.g. less than approximately 5.5 volts, transistors 4, 6, 8 and 10 provide a combined voltage drop of over 2.8 volts. Thus the voltage on node 12 is less than 2.7 Volts. Inverter 20 is designed to have a transition threshold at a little more than 2.7 Volts. Thus when $V_{dd}$ is less than 5.5 Volts, the output signal of inverter 20 is logical 1 and the output signal of inverter 22 is logical 0, which is provided on terminal 24. Conversely, a $V_{dd}$ greater than 5.5 volts causes a logical 1 output signal on terminal 24. The channel of transistor 14 in this embodiment is approximately 35 microns long. This provides a high resistance and limits the current from $V_{dd}$ to ground to approximately 1 micro amp in a non-over-voltage condition. When $V_{dd}$ is greater than 5.5 volts, the voltage on node 12 rises above 2.7 Volts in an over-voltage condition and a greater current is drawn through transistor 14, however, the current is still limited to approximately 5 micro amps. The over-voltage detector is one of many designs which may be effectively utilized with the invention. For example, comparators and Zener diode techniques may be effectively used. In addition, an over-voltage condition at the positive voltage supply is one of several factors which may be monitored by different embodiments of the invention. For example, high current consumption at the power supply, known circuit activity in response to input signals and internal over-voltage conditions are within the scope of the invention.

FIG. 2 is a block diagram showing an oscillator circuit 25 for providing two frequencies to the circuit of FIG. 3. Oscillator 26 is an oscillator of conventional design such as an inverter loop oscillator. When the present invention is used as a charge pump for a memory device an output signal having frequency of 10 Megahertz may be selected to be provided by oscillator 26. This frequency is fed to divide by 8 circuit 28 and terminal 30 which is provided as f2. Divide by 8 circuit 28 is a conventional frequency divider which provides a signal having a frequency ⅛th that provided by oscillator 26 on terminal 32. This signal is labeled as f1.

FIG. 3 is a logic diagram showing switching circuits or a multiplexer 33 for determining when the charge pumps of the present circuitry are to be driven at a frequency of f1 or f2 (FIG. 2). NOR gate 34 receives as input signals VDDOV from the circuit of FIG. 1 and a signal $\overline{R31}$ which is inverted by inverter 36. $\overline{R31}$ is a signal which operates in response to the row address strobe AS/ input signal of a memory containing the present circuit. A RAS signal indicates that data will soon be read and that additional substrate pumping may be required. When either VDDOV is a logical 1 or $\overline{R31}$ is a logical 0, NOR gate 34 provides a logical 0 to AND gate 38. AND gate 38 is fed by the output of NOR gate 34 and $\overline{RID}$. The input from $\overline{RID}$ ensures that additional substrate bias capacity is available to initiate the substrate to the selected voltage level. The present embodiment preferably includes circuitry (not shown) for limiting the substrate bias level. This may be effectively provided using conventional voltage limiting techniques.

During normal operating conditions, $\overline{RID}$ is a logical 1. Because $\overline{RID}$ is usually a logical 1, the output signal of AND gate 38 is, under normal circumstances, a function of VDDOV and $\overline{R31}$ (note: when $\overline{RID}$ is a logical 0, AND gate 38 provides a logical 0 output signal, regardless of the signal provided by NOR gate 34). When either VDDOV or $\overline{R31}$ is logical 1 or logical 0, respectively, AND gate 38 provides a logical 0 to NOR gates 40 and 42. A logical 0 is provided to one input of NOR gates 40 and 42, thus the output signal of NOR gates 40 and 42 is controlled by f2. Thus the output signal of NOR gate 40 has a frequency of f2 and the booster charge pump attached to output terminal 44 provides additional charge pumping capability in the high stress circumstances indicated by VDDOV, $\overline{RID}$ or $\overline{R31}$. The output signal of AND gate 38 is also provided to inverter 46 which provides a logical 1 to NOR gate 48. Because one input signal of NOR gate 48 is a logical 1, the output signal of NOR gate 48 is a logical 0. Thus NOR gate 50 is provided with a logical 0 input signal from NOR gate 48 and a signal oscillating from logical 1 to logical 0 in response to f2 from NOR gate 42. Thus the output signal of NOR gate 50 oscillates at a frequency equal to that provided by f2. Thus the main charge pump oscillates at the higher f2 frequency and the main charge pump provides additional boost to the integrated circuit.

When VDDOV is a logical 0, $\overline{R31}$ is a logical 1 and $\overline{RID}$ is a logical 1, AND gate 38 provides a logical 1 output signal. The logical 1 output signal from AND gate 38 provides a logical 1 input signal to NOR gates 40 and 42 and thus NOR gates 40 and 42 provide a logical 0 output signal regardless of the signals provided from f2. The logical 1 provided by AND gate 38 is inverted once by inverter 46 to provide a logical 0 input signal to NOR gate 48. Thus the output signal of NOR gate 48 oscillates in response to the f1 signal applied on the other input of NOR gate 48. The main charge pump is driven by frequency f1 and the booster charge pump is not driven at all. Because of the lower frequency of f1 and because the booster charge pump is off, the present described embodiment consumes far less power in the standby state where $\overline{RID}$, VDDOV and R31 do not indicate that the additional substrate biasing is needed. In another embodiment of the present invention, the booster charge pump may be omitted. In this embodiment, the increased frequency provided to the main charge pump is relied upon to provide the additional required capacity.

FIG. 4 is a schematic diagram of a charge pump. In the described embodiments two charge pumps are provided; the booster charge pump and the main charge pump. Charge pump 52 as shown in FIG. 4 is a circuit describing both the booster charge pump 53 and the main charge pump 55. Thus two of the circuits shown in FIG. 4 must be provided for the described embodiment. The $f_{in}$ input terminal is connected to the output signal of either NOR gate 50 for the main charge pump or the output signal of NOR gate 40 for the booster charge pump. The input signal provided on $f_{in}$ is inverted once by the inverter formed of transistors 54 and 56 and is inverted once again by the inverter formed by transistors 58 and 60. The output of inverter formed by transistors 58 and 60 is provided to capacitor 62. Capacitor 62 is biased on one plate by the output of the inverter formed by transistors 58 and 60 and biased on the other plate by the combination of transistors 64, and 66 and 68. Transistor 70 is gate strapped to the Vbb side of the transistor. Thus transistor 70 acts as a diode which allows current to flow from Vbb through transistor 70 to capacitor 62 only when the voltage on the plate of capacitor 62 connected to the drain of transistor 70 is less than Vbb.

When the signal provided by $f_{in}$ is a logical 1, the signal is inverted once by inverter comprising transistors 54 and 56 and inverted again by the inverter comprising transistors 58 and 60. Thus a high voltage signal, $V_{dd}$ is provided on plate A of capacitor 62. The logical 0 provided by the inverter comprising transistors 54 and 56 causes transistor 64 to be on. Thus $V_{dd}$ is applied to the gate of transistor 68 and a ground voltage is applied plate B of capacitor 62. Transistor 66 is off. Thus capacitor 62 has a stored charge equal to $V_{dd}$ times the capacitance of capacitor 62.

When $f_{in}$ goes from a logical 1 to a logical 0, the inverter comprising transistors 54 and 56 inverts the signal once and the inverter comprising transistors 58 and 60 inverts the signal again. Thus a logical 0 is applied to plate A of capacitor 62. At this instance the charge on capacitor 62 has not dissipated and thus the voltage on plate B of capacitor 62 is a level of $V_{dd}$ less than 0 volts. The input signal provided by $f_{in}$ is inverted once by the inverter comprising transistors 54 and 56. Thus a logical 1 is provided to the gates of transistors 64 and 66. Thus, transistor 64 is off and transistor 66 is on. Because the voltage provided on plate B of capacitor 62 is very low at this instance the charge on the gate of transistor 68 which caused transistor 68 to be on is quickly discharged through transistor 66. Thus, transistor 68 turns off. Therefore, the only source for current to dissipate the charge on plate B of transistor 62 is through transistor 70. Thus the voltage level on $V_{bb}$ is pulled below ground. Because the frequency provided on $f_{in}$ is a high frequency, constant charging occurs through $V_{bb}$ and a selected voltage can be determined by the size of transistor 68 and capacitor 62. Of course, the other transistors in the circuitry create an effect on the charge pumping capability of charge pump 52. However, the size of capacitor 62 and the size of transistor 68 provide the most prominent effects.

In the described embodiment, $V_{dd}$ being over a specified voltage and the initiation of $\overline{RAS}$ are used to trigger the high charge pumping rate. However, the scope of the present invention is not limited to voltage generation which is increased in capacity in response to those two signals. Many other signals may indicate the need for extra capacity in voltage generation, such as current flows into the integrated circuit or through specific devices and other voltages within the integrated circuit. In addition, the present invention is not limited to substrate biasing but may be used whenever a specific voltage level is required in a circuit.

FIGS. 5a and 5b are graphs depicting the $V_{bb}$ voltage level on a 1 megabit DRAM versus the $V_{dd}$ applied to the DRAM. The graph in FIG. 5A shows the $V_{bb}$ for a 1 megabit DRAM not including the described embodiment of the present invention. FIG. 5b shows the $V_{bb}$ in response to $V_{dd}$ with a 1 megabit DRAM including the described embodiment of the present invention. Note that the graph of FIG. 5b shows that appropriate substrate biasing is provided at a much higher level of $V_{dd}$ than that shown in FIG. 5a. In addition, because additional biasing is only provided when necessary, the described embodiment of the present invention provides far less power dissipation than circuitry known in the prior art.

Figure 7:
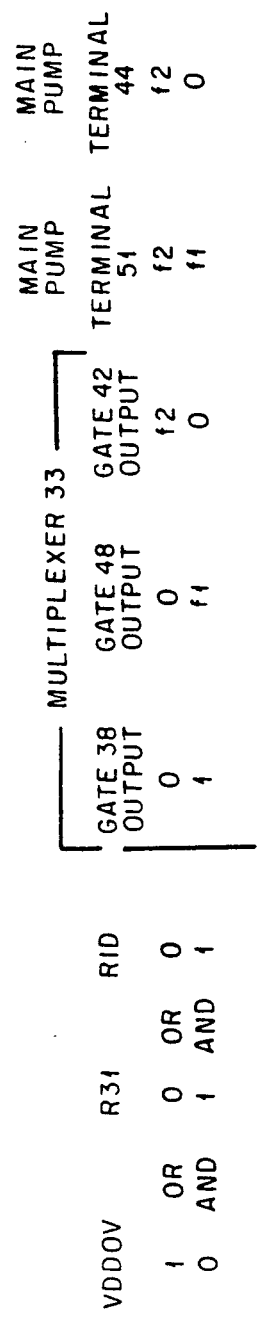
FIG. 7 is a table describing operation of the block diagram of FIG. 6.

In FIG. 6, the depicted detector 1, oscillator 25, multiplexer 33, main charge pump 53 and booster charge pump 55 all operate to generate substrate voltage Vbb in substrate 72. FIG. 7 lists several logical states of selected locations in the circuits of FIG. 6 as those circuits operate to generate the substrate voltage Vbb.

Although specific embodiments of the invention are described herein, they are not to be construed as limiting the scope of the present invention. The scope of the present invention is only limited by the claims appended hereto.

TECHNICAL ADVANTAGES

The described embodiments of the present invention provide a circuit wherein higher capacity voltage generation is provided when selected criteria indicate that additional capacity is required. When these criteria indicate that additional voltage generation is not required, the voltage generation circuitry is maintained in a low power state, thus providing high capacity with low power consumption.

What is claimed is:

1. A detector for controlling operation of a charge pump circuit in an integrated circuit formed in a substrate, said integrated circuit including complementary metal oxide semiconductor circuits arranged in dynamic random access memories and said charge pump generating a substrate voltage Vbb below the lowest voltage of a power supply, the supply furnishing a reference voltage Vss and a supply voltage Vdd, said detector comprising:
   a. a series of metal oxide semiconductor transistors formed in said substrate and presenting a current path between said power supply supply voltage and a node, a gate of each transistor being strapped to the side of the transistor connected in the path to the supply voltage Vdd, at least one of said transistors being directly connected to said supply voltage Vdd; said transistors each exhibiting a fixed voltage drop in response to current flowing through said path;
   b. a resistive transistor formed in said substrate and presenting a current path between said node and said reference voltage, said resistive transistor providing a high resistance even when the transistor is turned on thus limiting current flow along said path;
   c. switch circuits having an input connected to said node and producing a detector output signal on an output, said switch circuits having an input voltage switching threshold and producing said detector output signal in response to a voltage at said input exceeding said input voltage switching threshold; and
   d. a delay circuit coupled between said node and said reference voltage, said delay circuit strapping said node to said reference voltage and preventing production of said detector output signal in response to unstable voltages on the integrated circuit.

2. The device of claim 1 in which there are six circuit elements consisting of five metal oxide semiconductor transistors and one resistive metal oxide semiconductor transistor, and said input of said switch circuits connected between said four transistors and said one load transistor.

3. The device of claim 2 in which said input voltage switching threshold is about 2.7 volts.

4. The device of claim 1 in which said delay circuit comprises a metal oxide semiconductor transistor, said transistor presenting a current path between said node and said reference voltage, a gate of said transistor coupled to an inverter.

5. The device of claim 4 in which said inverter receives a signal triggered by the application of voltage to the integrated circuit.

6. The device of claim 1 in which a gate of said resistive transistor is connected to a gate of one of said series of metal oxide semiconductor transistors.

* * * * *